United States Patent
Mammen et al.

(10) Patent No.: US 10,561,045 B2
(45) Date of Patent: Feb. 11, 2020

(54) SURFACE MOUNT HEATSINK ATTACHMENT

(71) Applicant: DOLBY LABORATORIES LICENSING CORPORATION, San Francisco, CA (US)

(72) Inventors: Neil Mammen, San Jose, CA (US); Fred M. Sommer, San Jose, CA (US); Ankur Shah, Dublin, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 16/357,475

(22) Filed: Mar. 19, 2019

(65) Prior Publication Data

US 2019/0289755 A1    Sep. 19, 2019

Related U.S. Application Data

(60) Provisional application No. 62/644,680, filed on Mar. 19, 2018.

(30) Foreign Application Priority Data

Mar. 19, 2018  (EP) .................... 18162523

(51) Int. Cl.
| | |
|---|---|
| *F21V 15/00* | (2015.01) |
| *H05K 7/20* | (2006.01) |
| *H05K 1/02* | (2006.01) |
| *H05K 1/18* | (2006.01) |
| *H05K 5/00* | (2006.01) |
| *G02F 1/1335* | (2006.01) |
| *H01L 25/075* | (2006.01) |
| *F21V 29/70* | (2015.01) |
| *F21Y 105/16* | (2016.01) |

(Continued)

(52) U.S. Cl.
CPC ......... *H05K 7/20963* (2013.01); *F21V 29/70* (2015.01); *G02F 1/133603* (2013.01); *H01L 25/0753* (2013.01); *H05K 1/0204* (2013.01); *H05K 1/181* (2013.01); *H05K 5/0017* (2013.01); *H05K 7/20009* (2013.01); *F21Y 2105/16* (2016.08); *F21Y 2115/10* (2016.08); *F28F 3/06* (2013.01); *F28F 2275/08* (2013.01); *G02F 2001/133628* (2013.01); *H05K 2201/10106* (2013.01)

(58) Field of Classification Search
None
See application file for complete search history.

(56) References Cited

U.S. PATENT DOCUMENTS

| | | |
|---|---|---|
| 4,625,260 A | 11/1986 | Jordan |
| 5,870,285 A | 2/1999 | Kosteva |
| 9,316,385 B2 | 4/2016 | Maeda |

(Continued)

FOREIGN PATENT DOCUMENTS

| | | |
|---|---|---|
| DE | 3887801 | 7/1994 |
| EP | 1026928 | 8/2000 |

(Continued)

*Primary Examiner* — Vip Patel

(57) ABSTRACT

An electronic device includes a printed circuit board (PCB). One or more components mounted on at least one of a first side and a second side of the PCB. The first side and the second side are two opposite sides of the PCB. A plurality of solder blades mounted on the second side of the PCB one or more heatsinks inserted onto the plurality of solder blades mounted on the second side of the PCB.

19 Claims, 11 Drawing Sheets

(51) Int. Cl.
*F28F 3/06* (2006.01)
*F21Y 115/10* (2016.01)

(56) References Cited

U.S. PATENT DOCUMENTS

| | | |
|---|---|---|
| 2008/0068807 A1 | 3/2008 | Horng |
| 2010/0231804 A1 | 9/2010 | Hisakawa |
| 2011/0019415 A1 | 1/2011 | Chen |

FOREIGN PATENT DOCUMENTS

| | | |
|---|---|---|
| JP | 2008-299182 | 12/2008 |
| WO | 2009/128005 | 10/2009 |

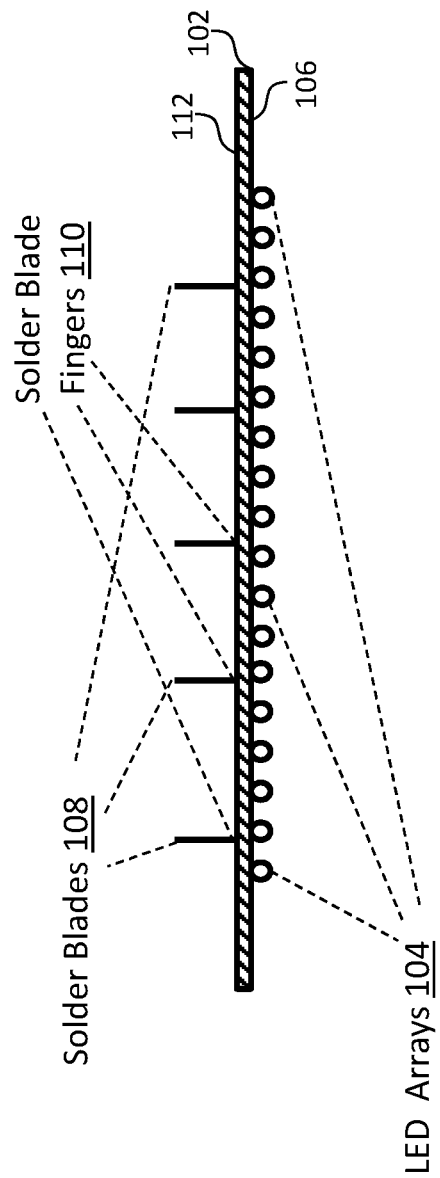

mount components on at least one of a first side and a second side of a PCB 402 mount solder blades on the second side of the PCB 404 insert heatsinks onto the solder blades mounted on the second side of the PCB 406 use removable clips to fasten the heatsinks to the PCB and the plurality of solder blades 408

*FIG. 4*

SURFACE MOUNT HEATSINK ATTACHMENT

CROSS-REFERENCE TO RELATED APPLICATION

This application claims the benefit of priority to U.S. patent application No. 62/644,480 filed Mar. 19, 2018 and European patent application No. 18162523.7 filed Mar. 19, 2018, which are hereby incorporated by reference in their entirety.

TECHNOLOGY

The present invention relates generally to heatsinks, and in particularly to surface mount heatsink attachment methods and devices.

BACKGROUND

Densely packed electrical, electronic and/or optoelectronic components may be used in a variety of devices. For example, densely packed high-power light emitting diodes (LEDs), which may be arranged in patterns such as arrays, can be used in display systems either to provide backlight that transmits through light modulation layers such as liquid crystal layers to render video images, or to provide modulated light to directly render video images. The video images may contain a wide range of possible luminance levels from the brightest white to the darkest black. Some or all LEDs in a display system can be turned on to generate high luminance values in bright image portions of the video images, and thus generate a large amount of heat over a unit time interval in operation. The generated heat, if not properly dissipated, can cause the LEDs and other components in the display system to operate in elevated temperatures outside their respective normal operational temperature ranges.

Performances and lifetimes of LEDs and other components can be highly dependent on their operational temperatures. For example, LEDs may not be able to support accurate light generation or to achieve normal long lifetimes if operating in elevated temperatures for extended periods of times.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF THE DRAWINGS

An embodiment of the present invention is illustrated by way of example, and not in way by limitation, in the figures of the accompanying drawings and in which like reference numerals refer to similar elements and in which:

FIG. 1A, 1B and FIG. 1C illustrate example light source devices before and after heatsinks are attached;

FIG. 4 illustrates an example method of heatsink attachment; and

DESCRIPTION OF EXAMPLE EMBODIMENTS

Figure 1B:
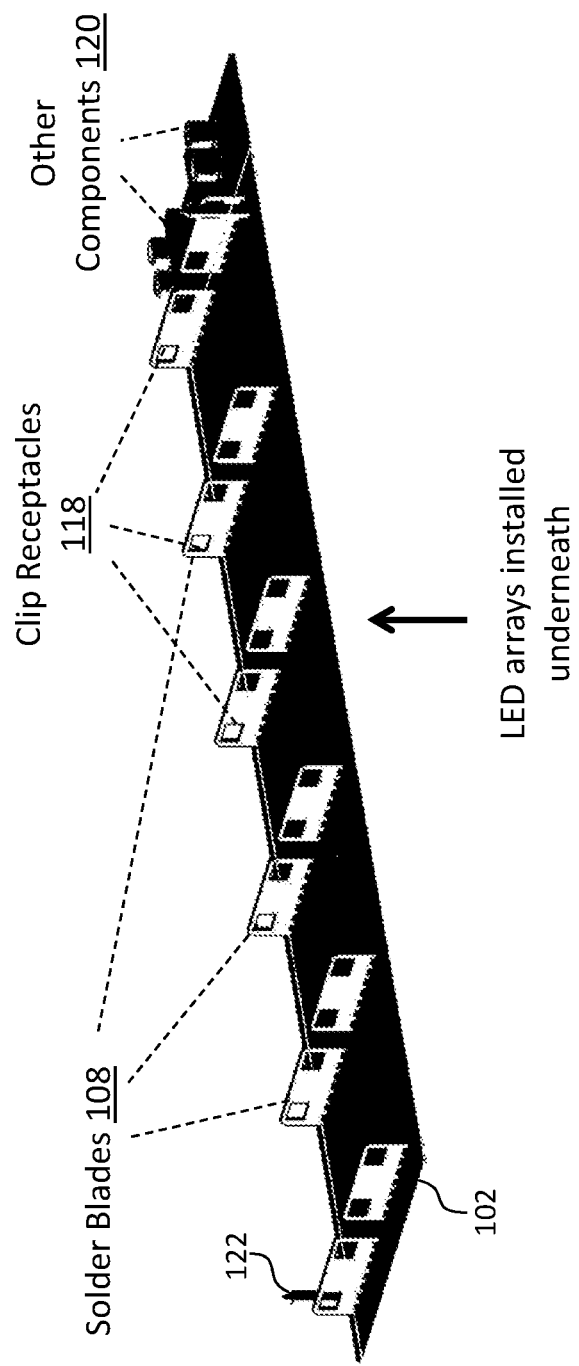

Heatsink attachment techniques are described herein. In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily occluding, obscuring, or obfuscating the present invention.

Overview

Heatsink attachment techniques as described herein can be applied to support effective thermal management of a wide variety of devices or components that may or may not be associated with display systems. By way of example, these techniques may be applied to support thermal management of printed circuit boards (PCBs) with densely packed LED arrays, which in operation can generate large amounts of heat per unit area per unit time in backlight units (BLUs) of LED displays, in display screens in cinemas, in micro-LED based displays, in non-display devices, and so forth.

Under other approaches, screws and/or glues are used to fasten heatsinks to PCBs.

In contrast, under heatsink attachment techniques as described herein, no screws and/or glues are needed to attach or fasten heatsinks to PCBs. These techniques can be applied to provide highly desirable thermal management solutions in challenging applications in which components are densely packed with a PCB that leaves no or little space available for screws or holes in between the components.

The heatsink attachment techniques as described herein can be applied to enable easy removal and/or replacement of heatsinks or other components in connection with PCBs to which the heatsinks are attached. Under these techniques, no glues are needed to attach a heatsink to a PCB; such gluing might make it difficult to remove heatsinks and other components (e.g., individual LEDs, individual LED arrays, etc.).

It should be noted that some or all heatsink attachment techniques as described herein could operate with gluing if appropriate in specific (device) applications. For example, some components including but not limited to heatsinks might (additionally, optionally or alternatively) be assembled into a device with some use of gluing if easy removal (e.g., glue-less removal, etc.) of those components need not be supported in these specific applications.

In some applications, densely packed components such as LEDs or LED arrays may be mounted or otherwise disposed on a PCB on a first side (or surface). A plurality of solder blades can be mounted on the PCB on a second side (or surface) that is opposite to the first side. To reduce assembly time, the plurality of solder blades may be mounted to the PCB via surface mount. The plurality of solder blades collectively acts as a heatsink attachment mechanism (e.g., a heatsink attachment assembly, a heatsink attachment apparatus, etc.).

A heatsink with slots (e.g., holes, etc.) matching positions and sizes of some or all solder blades in the plurality of solder blades can slide onto these solder blades, until the heatsink reaches a position that enables the heatsink to have direct physical contact with the PCB or with a thermal pad (e.g., electrically insulating but thermally conducting, etc.) inserted in between the PCB and the heatsink. The heatsink may be securely attached to the solder blades with relatively simple removable clips that slide through clip receptacles (e.g., openings, holes, etc.) located on the solder blades. Example heatsinks mounted through solder blades as described herein may include, but are not necessarily limited to only, any of: plate-type heatsinks (e.g., a simple metallic plate, etc.), fin-type heatsinks, pin-type heatsinks, complex shaped heatsinks (e.g., with spatial structures to provide relatively large heat transfer areas to ambient cooling media for heat dissipation, etc.), heatsinks with heat spreaders, and so forth.

In operation, the heatsink can be used to extract heat from components mounted on the PCB and dissipate the extracted heat through a cooling medium such as air or fluid for the purpose of supporting thermal management of the device comprising the components mounted on the PCB. Example components mounted on a PCB as described herein may include, but are not necessarily limited to only, any of: active components, power-consuming components, high-power components, densely packed LED arrays, power LEDs, high brightness LEDs, power transistors, lasers, microLEDs, CPUs, DSPs, discrete components, IC components, LED drivers, non-LED components, electrical components, electronic components, optoelectronic components, etc.

Example embodiments described herein relate to an electronic device comprising: a PCB; one or more components mounted on at least one of a first side and a second side of the PCB, wherein the first side and the second side are two opposite sides of the PCB; a plurality of solder blades mounted on the second side of the PCB; one or more heatsinks inserted onto the plurality of solder blades mounted on the second side of the PCB; a plurality of removable clips that fasten the one or more heatsinks to the PCB and the plurality of solder blades.

Example embodiments described herein relate to a method of heatsink attachment. One or more components are mounted on at least one of a first side and a second side of a PCB. The first side and the second side are two opposite sides of the PCB. A plurality of solder blades is mounted on the second side of the PCB. One or more heatsinks are mounted onto the plurality of solder blades mounted on the second side of the PCB. A plurality of removable clips is used to fasten the one or more heatsinks to the PCB and the plurality of solder blades.

Example embodiments described herein relate to a display device comprising: a light source device that includes: a printed circuit board (PCB), one or more light emitting diode (LED) arrays disposed on a first side of the PCB, a plurality of solder blades mounted through a plurality of fingers on a second side of the PCB via surface mount, one or more heatsinks attached to the plurality of solder blades; and one or more light modulation layers that comprise a plurality of light modulation units illuminated by light emitted by the one or more LED arrays. Individual light modulation states of light modulation units in the plurality of light modulation units are set based at least in part on image content of one or more video images to be rendered by the display device.

Example embodiments described herein relate to a display device comprising: a light source device that includes: a printed circuit board (PCB), one or more light emitting diode (LED) arrays disposed on a first side of the PCB, a plurality of solder blades mounted through a plurality of fingers on a second side of the PCB via surface mount, one or more heatsinks attached to the plurality of solder blades, etc. Individual LEDs in the one or more LED arrays are to emit modulated light that is modulated based at least in part on image content of one or more video images to be rendered by the display device.

Light Source Devices

Figure 2A:
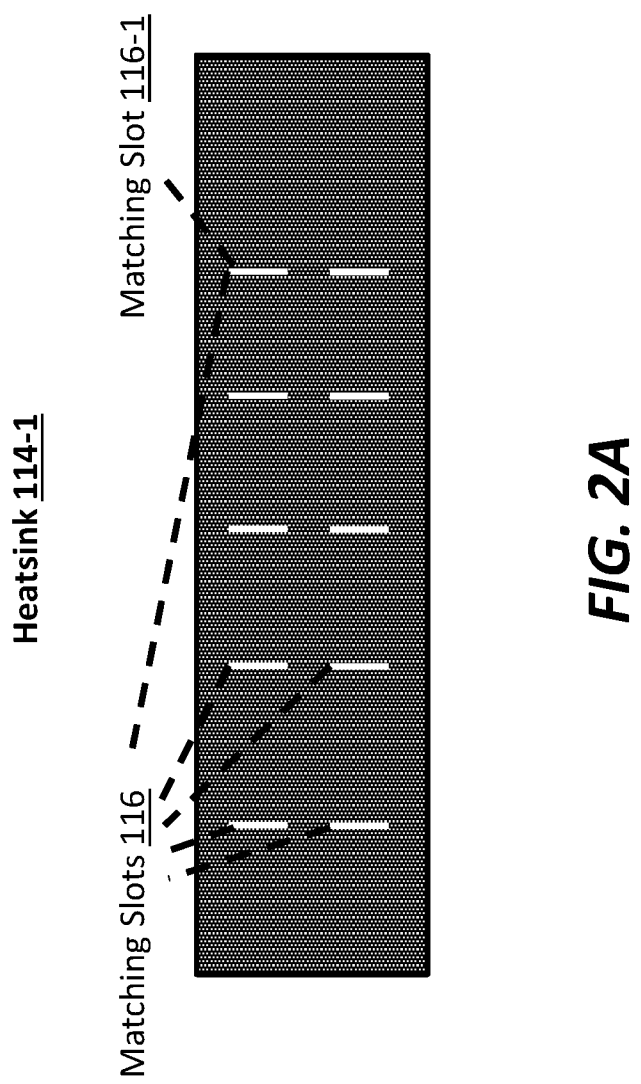
FIG. 2A illustrates an example heatsink.

FIG. 1A illustrates an example light source device 100-1 before one or more heatsinks (e.g., 114 as illustrated in FIG. 2A, etc.) are attached, according to an embodiment. As depicted, before the one or more heatsinks are attached to the plurality of solder blades (108), the light source device (100-1) includes a PCB 102, one or more LED arrays 104 disposed on a first side 106 (e.g., a planar surface, a curved surface, etc.) of the PCB (102), a plurality of solder blades 108 mounted through a plurality of solder fingers 110 on a second side 112 (opposite to the first side (106)) of the PCB (102) via surface mount, and so forth.

The PCB (102) may comprise one or more metallic sheet layers laminated onto and/or between non-conductive substrate sheet layers. Conductive tracks, pads and other features may be etched or imprinted with the metallic sheet layers to electrically interconnect some or all electrical, electronic and/or optoelectronic components of the light source device (100-1) based at least in part on a circuit design/scheme of the light source device (100-1).

Other components including but not limited to LED drivers (not shown in FIG. 1A) may be soldered onto the PCB (102) via surface mounting or through-hole mounting on the first side (106) and/or the second side (112). The other components may be used to provide and/or control (e.g., individually controllable, etc.) electric currents and/or voltages to some or all of (e.g., individual, etc.) LEDs of the one or more LED arrays (104).

The PCB (102) may be a standard PCB type, or alternatively may be a non-standard PCB type based on application requirements. The PCB (102) may be single-sided (e.g., one copper layer), double-sided (e.g., two copper layers on both sides of one substrate layer), or multi-layer (e.g., outer and inner layers of copper, alternating with layers of substrate). The PCB (102) may support a relatively high component density such as electrically connecting with hundreds, thousands or a higher number of individual LEDs per unit area (e.g., per square centimeter, etc.) on at least one of the first side (106) and the second side (112).

The PCB (102) may, but is not limited to only, be constructed with thermal conductive materials with relatively high thermal conductivities (e.g., copper, aluminum, dielectric materials with relatively high thermal conductivities, dielectric films of relatively high thermal conductivities, etc.). Additionally, optionally or alternatively, one or both of the first side (106) and the second side (112) of the PCB (102) may be coated or bonded with one or more thermally conductive electrically isolative layers to prevent unintended electric contacts. The thermally conductive electrically isolative layers (e.g., films, etc.) may have normal to high thermal conductivity and zero or near-zero electrical conductivity.

The components mounted with the PCB (102) can be arranged in any pattern in a wide variety of regular or irregular patterns. By way of example but not limitation, the plurality of LEDs in the one or more LED arrays (104) may be disposed or mounted to the PCB (102) in an array pattern (e.g., a grid pattern, etc.) on the first side (106) of the PCB (102). An individual LED in the one or more LED arrays (104) may include an optical lens, bonding wires, electrodes, encapsulation resin, etc.

In an embodiment, the plurality of individual LEDs in the one or more LED arrays (104) is disposed on support substrates (e.g., tiles, etc.) separate from the PCB (102); the support substrates can be disposed or mounted to the PCB (102) via through-hole mounting or surface mounting. Additionally, optionally or alternatively, individual LEDs in the one or more LED arrays (104) can be placed in, or bonded to, the PCB (102) directly via soldering (e.g., via surface mount based soldering, etc.).

In some embodiments, the one or more LED arrays (104) may have relatively high packing densities up to several tens, several hundreds, several thousands or more individual LEDs per square centimeter. With the relatively high packing densities, the one or more LED arrays (104) may consume a relatively high total amount of power (e.g., 50 watts or more, etc.) per square centimeter. Accordingly, the one or more LED arrays (104) may generate a large amount of heat per square centimeter per unit time (e.g., in seconds, etc.) from energies that have not been converted to light or that have been converted to heat by light radiation or absorption.

Given the relatively high densities of the one or more LED arrays (104) on the first side (106) of the PCB (102), there may be little or no space on the first side (106) of the PCB (102) for screws or mounting holes to be used for securing or attaching heatsinks to the PCB (102) to help dissipate the heat generated by the one or more LED arrays (104) and/or any arrays or assemblies of heat-generating components mounted on the first side (106) of the PCB (102).

In some embodiments, the light source device (100-1) may be a part of an overall device (or a hosting device) such as a display device, etc. For example, the light source device (100-1) may represent some or all of a backlight unit (BLU) in such a display device. In some embodiments in which the light source device (100-1) is used as a backlight unit (BLU) in a display device, the display device may comprise a physical frame (or housing) to which the light source device (100-1) is to be securely attached. Heatsink attachment techniques as described herein can be used to avoid placing screws in some (e.g., substantially all, central portions, etc.) or all of the array pattern within which the plurality of LEDs is arranged. However, it is possible that a few mounting holes, pins, etc., may be provisioned on the PCB (102) outside, or near edges of, the array pattern to mount the light source device (100-1) to the physical frame of the overall device.

In the embodiments in which the light source device (100-1) is used as a backlight unit (BLU) in a display device, additional layers such as one or more of light reflective films, brightness enhancement films, and so forth, may be further disposed (e.g., glued on, etc.) between the plurality of LEDs and light modulation layers of the display device to recirculate reflective light into transmissive light in optical paths towards a viewer of the display device. Heatsink attachment techniques as described herein enable relatively easy removal and/or replacement of a heatsink from the second side (112) of the PCB (102) without affecting (or removing) any components such as LEDs or any additional layers located on the first side (106) of the PCB (102). At the same time, these techniques also enable relatively easy removal and/or replacement of any, some or all components and/or additional layers disposed on the first side (106) of the PCB (102) without affecting (or moving) any heatsink mounted on the second side (112) of the PCB (102).

FIG. 1B illustrates an example perspective view of a light source device 100-1 before one or more heatsinks (e.g., 114 as illustrated in FIG. 2A, etc.) are attached, according to an embodiment. One or more LED arrays (e.g., 104 of FIG. 1A, etc.) are disposed on a first side (e.g., 106 of FIG. 1A, etc.) underneath the PCB (102). A plurality of solder blades (e.g., 108, etc.) are mounted through a plurality of solder fingers (e.g., 110 of FIG. 1A, etc.) on a second side (e.g., 112 of FIG. 1A, etc.) above the PCB (102), for example via surface mount. The one or more heatsinks can slide onto the plurality of solder blades (108) through a plurality of matching slots (e.g., premade holes, 116 of FIG. 2A, etc.) on the one or more heatsinks. Subsequently, removable clips may slide into a plurality of clip receptacles 118 (e.g., premade, etc.) on the plurality of solder blades (108) to secure direct physical contact of the one or more heatsinks with the PCB (102), or with a thermal pad inserted in between the one or more heatsinks and the PCB (102).

In some embodiments, the PCB (102) may comprise other electrical, electronic and/or optoelectronic components 120 including but not limited to LED drivers, power supply components, discrete components, IC components, components mounted on the PCB (102) through surface mounting, components mounted on the PCB (102) through through-hole mounting, and so forth. Some or all of these other components (120) may be located on the same side of the one or more LED arrays (104) but outside the array pattern formed by the one or more LED arrays (104). In some embodiments, at least some of the other components (120) such as LED drivers may be mounted in interstitial spatial regions on the second side (e.g., 112 of FIG. 1A, the opposite side of the one or more LED arrays (104), etc.) of the PCB (102) between neighboring solder blades in the plurality of solder blades (108).

Additionally, optionally or alternatively, (e.g., a relatively small number of, near edges of the PCB (102), etc.) mounting holes, screws, pins, and so forth, may be used with the PCB (102) to provide a securing mechanism 122 to secure the PCB (102) to a physical frame of a hosting device such as a display device, a non-display device, etc.

FIG. 2A illustrates an example heatsink 114, according to an embodiment. For the purpose of illustration only, the heatsink (114) may be made of a solid metallic plate. A plurality of matching slots (or holes) 116 can be bored, drilled, punctured, perforated, etc., at specific positions on the heatsink (114). The specific positions of matching slots in the plurality of matching slots (116) on the heatsink (114) are designed to match specific positions of some or all of the plurality of solder blades (108) mounted on the PCB (102) to enable sliding/inserting the heatsink (114) into these solder blades until a position in direct physical contact (e.g., direct thermal contact, etc.) with the PCB (102) or with one side of a thermal pad which comprises the other side in direct physical contact (e.g., direct thermal contact, etc.) with the PCB (102) or with a thermal pad inserted between the heatsink (114) and the PCB (102).

In some embodiments in which the direct physical contact (e.g., direct thermal contact, etc.) is made with the PCB (102), the direct physical contact can be made between a first surface (e.g., the lower surface, etc.) of the heatsink (114) and the second side (112) of the PCB (102).

In some embodiments in which a thermal pad is inserted between the heatsink (114) and the PCB (102), the direct physical contact can be made between the first surface (e.g., the lower surface, etc.) of the heatsink (114) and the thermal pad, which in turn may be in direct physical contact with the second side (112) of the PCB (102).

Shapes and sizes of the matching slots in the plurality of matching slots (116) on the heatsink (114) are designed to match specific shapes and sizes of some or all of the plurality of solder blades (108) mounted on the PCB (102) to maximize the total spatial area of the direct physical contact of the heatsink (114) with the PCB (102) or with a thermal pad inserted in between the heatsink (114) and the PCB (102). For example, longitudinal and transverse dimensions/lengths of a matching slot (e.g., 116-1, etc.) in the plurality of matching slots (116) on the heatsink (114) may be set to be the same as (or slightly larger than) longitudinal and transverse dimensions/lengths (e.g., 204 of FIG. 2B and 206 of FIG. 2C, etc.) of a solder blade into which the matching slot (116-1) is to be inserted.

As a result of soldering the solder blades (108) onto the PCB (102), small bulges/overflows may be formed around fingers of the solder blades (108) on the PCB (102). In some embodiments, physical configurations of the matching slots in the plurality of matching slots (116) on the heatsink (114) may be adjusted/adapted to have shapes and/or sizes on a first (e.g., lower, etc.) side—of the heatsink (114)—in physical contact with the PCB (102) or with the thermal pad inserted between the heatsink (114) and the PCB (102) different than shapes and/or sizes on a second (e.g., upper, etc.) side—of the heatsink (114)—not in physical contact with the PCB (102) or with the thermal pad. For example, the shapes and/or the sizes of the matching slots (116) on the first side may be larger than the shapes and/or the sizes of the matching slots (116) on the second side to enable the heatsink (114) to be more securely and tightly in contact with the PCB (102) or the thermal pad with a maximized physical contact area.

Thus, under techniques as described herein, the heatsink (114) can be directly attached to the plurality of solder blades (108), instead of directly mounted on the PCB (102) through screws and mounting holes on the PCB (102). In addition, the plurality of solder blades (108), which acts as a heatsink attachment mechanism (e.g., device, component, apparatus, etc.), can be soldered onto the PCB (102), for example only through surface mounting without using any screws and mounting holes in the PCB (102). Using surface mount technologies to mount the plurality of solder blades (108) allows using a single manufacturing setup such as a normal PCB component assembly process to mount solder blades and non-solder-blade components to the PCB (102), thereby avoiding a second separate manufacturing set up (e.g., using adhesion, soldering other than surface mount, etc.) as well as reducing assembly time. In addition, solder (e.g., solder used in surface mount, etc.) is a better thermal conductor, and provides a stronger joint, than glue.

The attachment of the heatsink (114) to the PCB (102) through the solder blades (108) may be further securely with a plurality of (e.g., relatively simple, etc.) removable clips that slide through openings (or holes) located on the plurality of solder blades (108).

Figure 2C:
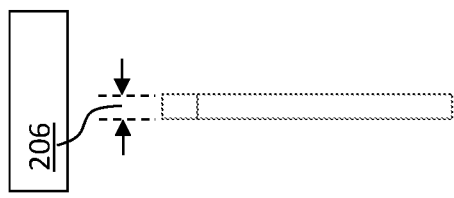
FIG. 2B and FIG. 2C illustrate two cross sectional views of an example solder blade.
Figure 2B:
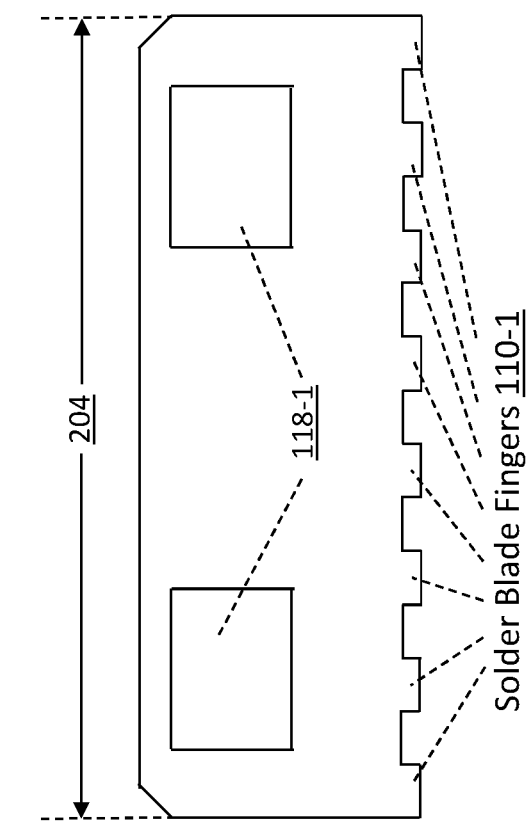

FIG. 2B and FIG. 2C illustrate two cross sectional views of an example solder blade 108-1, in one embodiment. The solder blade (108-1) may, but is necessarily limited to only, be made of a solid metallic plate. Example materials for constructing a solder blade as described herein include, but are not necessarily limited to only, any of: oxygen-free copper (OFC), oxygen-free high thermal conductivity (OFHC) copper, oxygen-free aluminum, other types of metals, metallic alloys, non-metallic materials, and so forth. The solder blade (108-1) comprises a plurality of solder fingers 110-1 at a first end (e.g., the lower end, etc.) of the solder blade (108-1), which are to be soldered onto the PCB (102), for example via surface mounting.

As depicted in FIG. 2B, the total number of solder fingers in the plurality of solder fingers (110-1) may, but is not necessarily limited to only, four, six, eight, etc. Widths, pitches or distances between adjacent fingers in the plurality of solder fingers (110-1) can be determined based on specific applications (e.g., display applications, non-display applications, etc.) to be supported by the device. For example, an interstitial distance between two adjacent fingers in the plurality of solder fingers (110-1) may be set far enough wide to run two, three, four or more traces through the two adjacent fingers.

Before the solder blade (108-1) is soldered onto the PCB (102), one or more clip receptacles 118-1 may be premade, bored, drilled, punctured, perforated, etc., at one or more spatial positions on (e.g., spanning over, etc.) the solder blade (108-1).

Figure 2D:
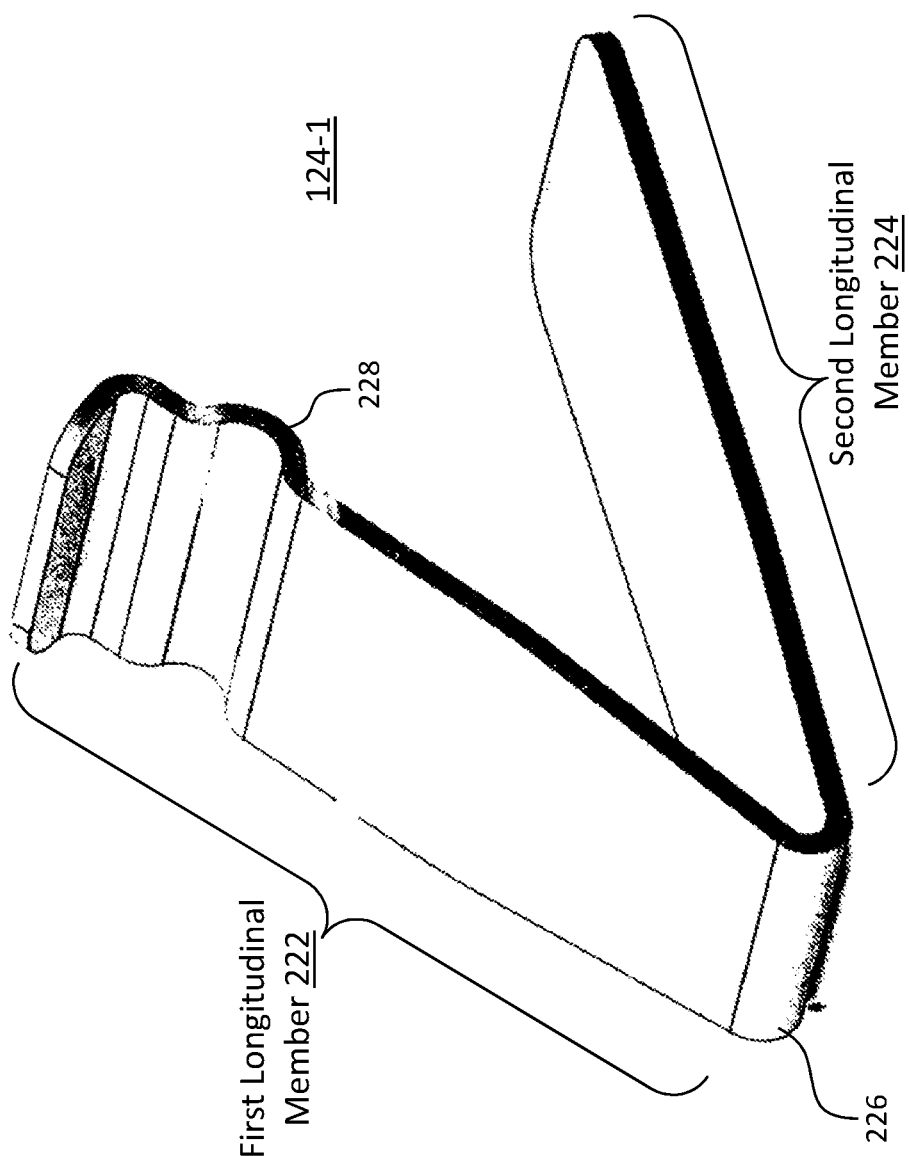
FIG. 2D illustrates an example removable clip.

FIG. 2D illustrates an example removable clip 124-1 that comprise two longitudinal members 222 and 224 joining through a connecting member 226. The connecting member (226) may, but is not limited to, be a curve shape member comprising two ends dovetailing with the two longitudinal members (222 and 224) to form the removal clip (124-1) as a contiguous physical part.

The removable clip (124-1) can plug or slide lengthwise into a clip receptacle such as an opening (or hole) on a solder blade among the plurality of solder blades (108) until a recessed portion 228 near the opening end of the first longitudinal member (222) of the removable clip (124-1) coincides with edges/walls/boundaries of the opening on the solder blade. The recessed portion (228) near the opening end of the first longitudinal member (222) of the removable clip (124-1) may be formed by a bended shape protruding toward the second longitudinal member (224) of the removable clip (124-1).

The removable clip (124-1) comprises an outer surface (e.g., a planar surface, etc.) on the second longitudinal member (222). After the removable clip (124-1) inserts into the opening on the solder blades so that the recessed portion (228) coincides with the walls of the opening on the solder blade, the removable clip (124-1) makes direct physical contact with a second surface (e.g., the upper surface, opposite to the first surface, etc.) of the heatsink (114). Through this direct physical contact with the second surface of the heatsink (114), the removable clip (124-1) applies physical forces or pressures (e.g., along the downward direction in FIG. 1A, etc.) on the heatsink (114) towards the PCB (102).

As the heatsink (114) can be plugged (or can slide) into the plurality of solder blades (108) without screws and glues, and as the direct physical contact of the heatsink (114) with the PCB (102) or the thermal pad can be further secured through a plurality of removal clips (e.g., 124-1, etc.), the total amount of heatsink assembly time can be minimized under techniques as described herein, in contrast with other approaches under which a heatsink is secured through glues or screws.

For the purpose of illustration only, it has been described that the heatsink (114) may be made of a simple metallic plate. It should be noted that in various embodiments, other heatsink types can be used to provide relatively larger heat transfer/dissipation areas to an ambient or cooling medium and improve heat dissipation, and so forth, in addition to or in place of the heatsink made of a simple metallic plate. Example geometries of heatsinks as described herein may include, but are not necessarily limited to only, any of: simple plate, with fins, with extrusions, with pins extensions, with heat spreaders, with crosscuts, with straight cuts at regular or irregular intervals/distances, with large or small thicknesses, etc. Exclusions in a heatsink may be spikes, fins, cylindrical, elliptical, square, other regular or irregular shapes. Additionally, optionally or alternatively, example materials for constructing a heatsink as described herein include, but are not necessarily limited to only, any of: copper, aluminum, other types of metals, metallic alloys, composite materials, non-metallic materials, and so forth. Thus, these and other types of heatsinks may be attached to PCBs (e.g., 102 of FIG. 1A, etc.) through solder blades and removable clips as described herein.

Figure 1C:
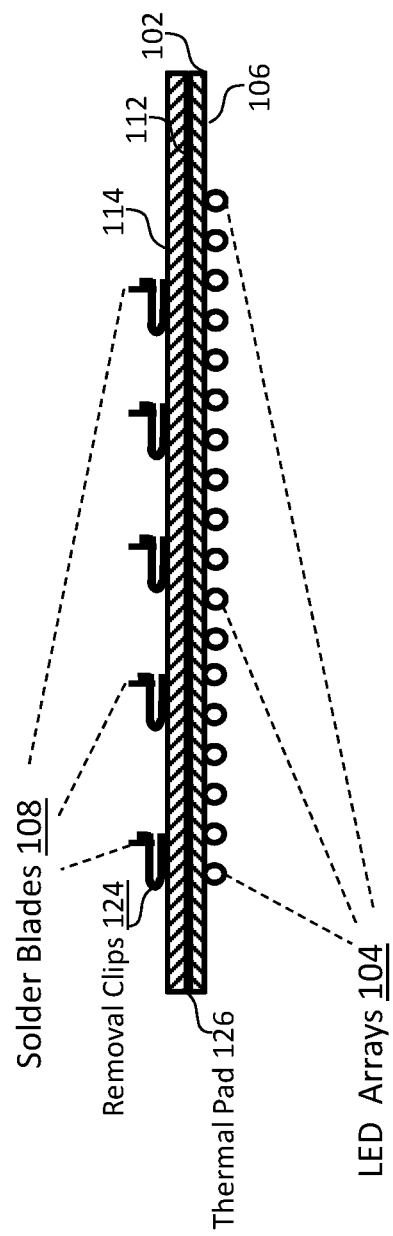

FIG. 1C illustrates an example light source device (e.g., 100-1 of FIG. 1A, etc.) after one or more heatsinks 114 (e.g., 114-1 as illustrated in FIG. 2A, etc.) are attached, according to an embodiment. In this example configuration as depicted in FIG. 1C, after the one or more heatsinks (114) are attached to a plurality of solder blades (e.g., 108 of FIG. 1A, etc.) that have been soldered to a PCB (e.g., 102 of FIG. 1A, etc.), the light source device (100-1) includes the PCB (102), one or more LED arrays (e.g., 104 of FIG. 1A, etc.) disposed on a first side (e.g., 106 of FIG. 1A, a planar surface, a curved surface, etc.) of the PCB (102), the plurality of solder blades (108) mounted through a plurality of solder fingers (e.g., 110 of FIG. 1A, 110-1 of FIG. 1B, etc.) on a second side (e.g., 112 of FIG. 1A, etc.) of the PCB (102) via surface mount, the one or more heatsinks (114), a thermal pad 126 inserted between the PCB (102) and the one or more heatsinks (114), a plurality of removable clips 124 (e.g., 124-1 of FIG. 2D, etc.) used to secure direct physical contact between the one or more heatsinks (114) and the thermal pad (126), and so forth.

The thermal pad (126) is designed to have a relatively high thermal conductivity from the PCB side of the thermal pad (126) to the heatsink side of the thermal pad (126). In some embodiments, the thermal pad (126) covers all or substantially all of the entire surface area on the second side (112) of the PCB (102) except portions of the surface area that correspond to solder joints between the plurality of solder blades and the PCB (102). The thermal pad (126) makes direct physical contact with both the PCB (102) and the one or more heatsinks (114) to ensure large amounts of heat per unit area per unit time generated by the plurality of LED arrays (104) mounted on the first side (106) to be efficiently transferred through the thermal pad (126) to the one or more heatsinks (114).

For the purpose of illustration, it has been described that a heatsink can be attached to a PCB (or a module) through solder blades that are soldered to the PCB, for example using surface mount technologies. It should be noted that, in various embodiments, surface mount technologies and other non-surface-mount technologies may be used to mount solder blades to a PCB as described herein. In an example, a solder blade may be glued to a PCB instead of or in addition to soldering.

For the purpose of illustration, a heatsink may be inserted into solder blades. It should be noted that, in various embodiments, the heatsink may be connect to solder blades as described herein in one or more of multiple ways including but not limited to screwing, (removable or non-removable) clipping, gluing, pressing in and so forth, in addition to or in place of using removable clips to fasten a heatsink to a PCB.

Display and Non-Display Devices

Heatsinks can be attached through solder blades as described herein to PCBs in a wide variety of display or non-display devices for the purpose of supporting thermal management. PCBs with or without LED components can use heatsink attachment techniques as described herein to attach to heatsinks to avoid using screws and/or drilling holes through the PCBs, especially in device applications where there are only very limited spaces available on the PCBs for securing heatsinks with screws.

Example devices as described herein may include, but are not necessarily limited to only, any of: a BLU of a display system, a non-BLU module of the display system, a generic display, a MicroLED display, an OLED display, a quantum-dot display, a laser-based display, a commercial cinema display, a home theater display, a television, a non-display device, a set-top box, a video source device, a video coding device, an audio device, an audiovisual device, etc.

In some embodiments, in BLU-illuminated display devices, light emitters such as quantum dots, OLEDs, LEDs, microLEDs, lasers, and so forth, may be arrayed or otherwise disposed on first sides of PCBs (or other structures such as LED array tiles, etc.) as parts of BLUs in the display devices. The light emitters, which operate with other components, generate backlight in image rendering operations of the display devices. The generated backlight transmits through light modulation layers that modulate the backlight based on pixel values of video images to render the video images.

Figure 3A:
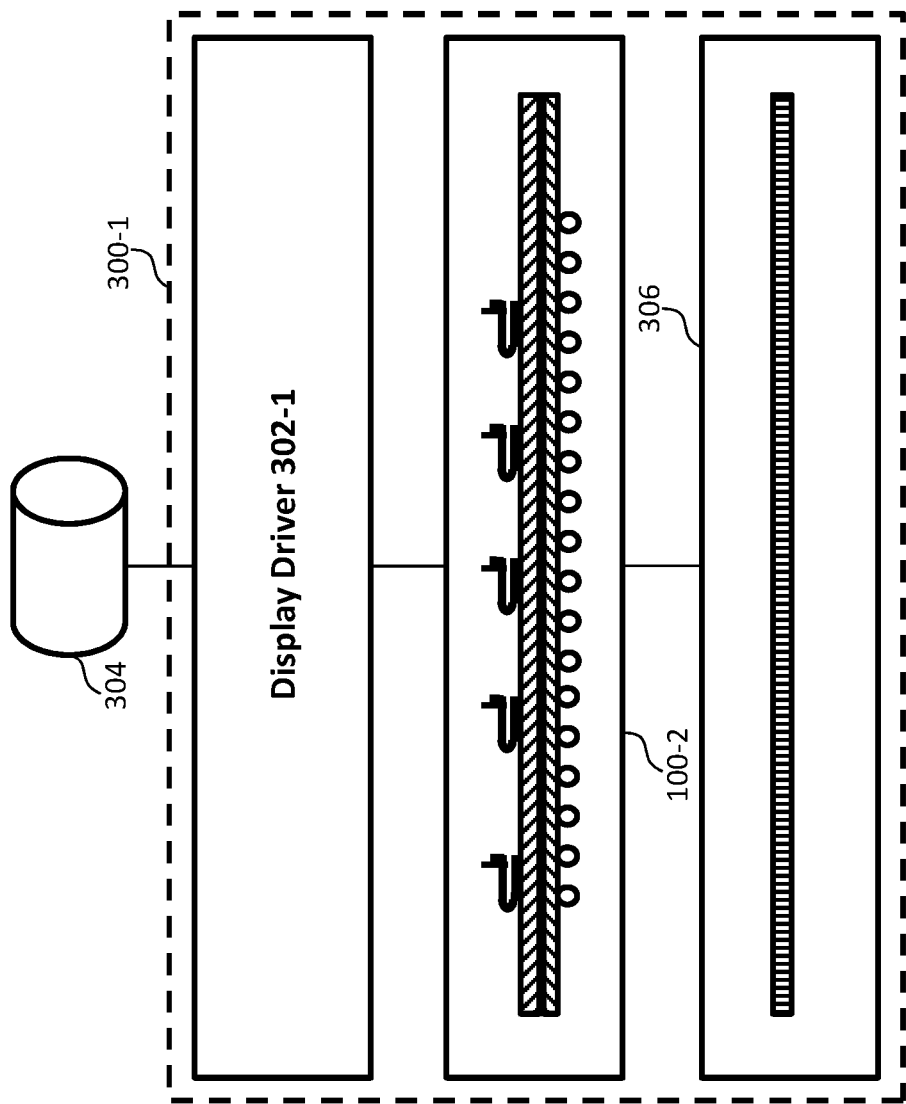
FIG. 3A, FIG. 3B and FIG. 3C illustrate example display and non-display devices.

FIG. 3A illustrates an example display device 300-1 in which one or more light source devices 100-2 are used to as backlight units (BLUs) in the display device (300-1) to illuminate one or more light modulation layers 306 comprising light valves. Each light source device in the one or more light source devices (100-2) may, but is not necessarily limited to, be a light source device 100-1 as illustrated in FIG. 1C. Each of the one or more light source devices (100-2) is used to illuminate a designated (e.g., area, etc.) portion of the one or more light modulation layers 306.

In a non-limiting implementation example, the light valves in the one or more light modulation layers (306) may be implemented by one or more liquid crystal layers with a plurality of unit structures each of which may be used as a pixel or a subpixel for rendering the video images. Individual transmittances (e.g., capabilities of transmitting light, etc.) of individual light valves (e.g., unit structures in the liquid crystal layers, pixels, subpixels, etc.) in the one or more light modulation layers (306) can be set by a display driver 302-1 in the display device (300-1) based on image data from an image data source 304 in a variety of ways including from over-the-air broadcast, a set-top box, a networked server coupled to the display device (300-1), a storage medium, etc.

In some embodiments, the display device (300-1) comprises a light source controller operating with the display driver (302-1) to control brightness levels of LEDs in one or more LED arrays (e.g., 104 of FIG. 1A or FIG. 1C, etc.) through global and/or local dimming operations. In some embodiments, some or all of the global and/or local dimming operations may be based on (e.g., a downsampled version of, a resampled version of, etc.) the image data received from the image data source (304).

In some embodiments, in direct emissive display devices, light emitters such as quantum dots, OLEDs, LEDs, microLEDs, lasers, and so forth, may be arrayed or otherwise disposed on first sides of PCBs (or other structures such as LED array tiles, etc.) in the display devices to emit modulated light (e.g., without separate light modulation layers such as liquid crystal layers, etc.) at an image rendering surface to directly render video images to a viewer of the image rendering surface. The light emitters, which operate with other components, directly generate the modulated light to render the video images in image rendering operations of the display devices based on pixel values of the video images.

Figure 3B:
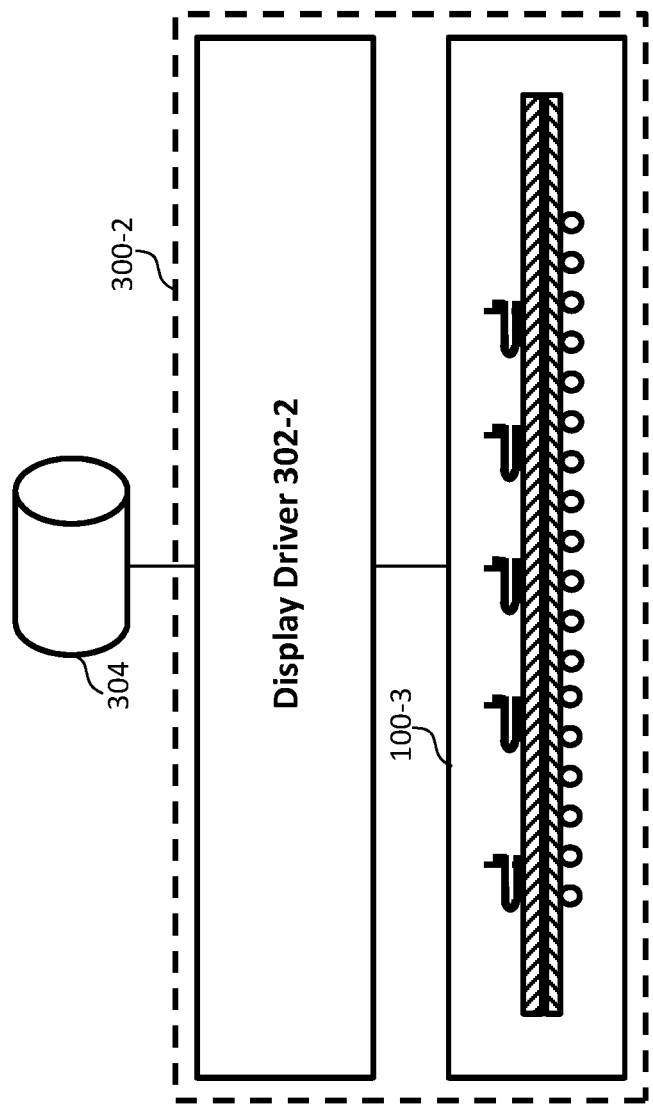

FIG. 3B illustrates an example display device 300-2 in which one or more light source devices 100-3 are used to emit modulated light to directly render images in the display device (300-2). Each light source device in the one or more light source devices (100-3) may, but is not necessarily limited to, be a light source device 100-1 as illustrated in FIG. 1C.

In some embodiments, the direct emissive display device (300-3) can be free of any light modulation layers (306) that comprise light valves. as the one or more light source devices (100-3) already emit modulated light that directly renders the video images to be seen by a viewer. LED arrays (e.g., 104 of FIG. 1C, etc.) in the light source devices (100-3) comprise LEDs (e.g., microLEDs, etc.) of relatively small footprints or sizes (e.g., microLEDs, etc.). Each LED in the LED arrays may correspond to (or represent) a pixel or a subpixel.

Each of the one or more light source devices (100-2) is used to emit modulated light for directly rendering a respective portion of a video image. Individual light emittances (e.g., capabilities of transmitting light, etc.) of individual LEDs (e.g., pixels, subpixels, etc.) in the light source devices (300-3) can be set by a display driver 302-2 in the display device (300-2) based on image data from an image data source 304 in a variety of ways including from over-the-air broadcast, a set-top box, a networked server coupled to the display device (300-2), a storage medium, etc.

In some embodiments, in non-display devices, components such as some or all of power transistors, lasers, LEDs, microLEDs, light emitters, CPUs, DSPs, discrete components, IC components, active components, power-consuming components, high-power components, lasers, LED drivers, non-LED components, electrical components, electronic components, optoelectronic components, etc., may be mounted or otherwise disposed on single or double sides of PCBs (or other structures such as LED array tiles, etc.) in the non-display devices to perform specific functions.

Figure 3C:
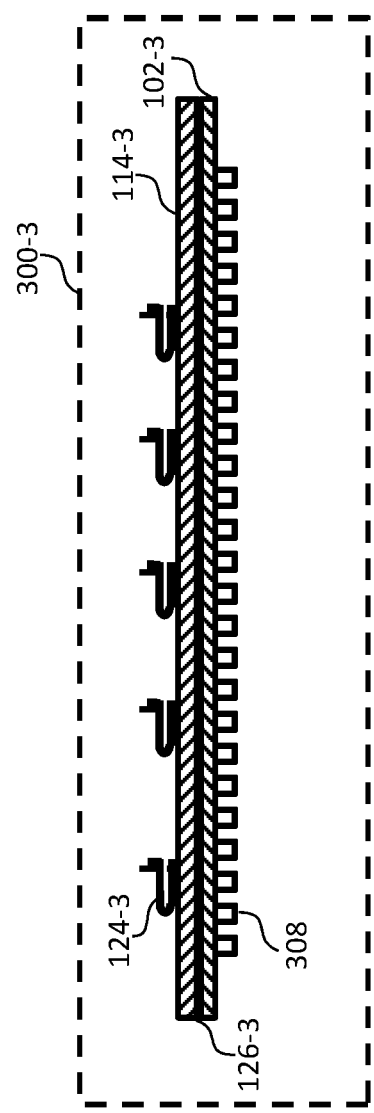

FIG. 3C illustrates an example device 300-3, according to an embodiment. The device (300-3) may or may not be a display device or a part thereof. The device (300-3) may or may not be a source light source device or a part thereof.

As illustrated, the device (300-3) includes a PCB 102-3, one or more components 308 disposed on a first side of the PCB (102-3), a plurality of solder blades mounted through a plurality of solder fingers on a second side (opposite side to the first side) of the PCB (102-3) via surface mount, one or more heatsinks 114-3, a thermal pad 126-3 inserted between the PCB (102-3) and the one or more heatsinks (114-3), a plurality of removable clips 124-3 used to secure direct physical contact between the one or more heatsinks (114-3) and the thermal pad (126-3), and so forth.

The thermal pad (126-3) is designed to have a relatively high thermal conductivity from the PCB side of the thermal pad (126-3) to the heatsink side of the thermal pad (126-3). In some embodiments, the thermal pad (126-3) covers all or substantially all of the entire surface area on the second side of the PCB (102-3) except portions of the surface area that correspond to solder joints between the plurality of solder blades and the PCB (102-3). The thermal pad (126-3) makes direct physical contact with both the PCB (102-3) and the one or more heatsinks (114-3) to ensure a large amount of heat per unit area per unit time generated by the components (308) mounted on the first side (and the second side) of the PCB (102-3) to be efficiently transferred through the thermal pad (126-3) to the one or more heatsinks (114-3).

In some or all of these devices (e.g., as illustrated in FIG. 3A through FIG. 3C, etc.), heatsinks can be attached to one sides (e.g., second sides opposite to the first sides, etc.) of the PCBs (or the other structures) to extract heat from the light emitters and other components mounted on the PCBs in the display or non-display devices and to dissipate the extracted heat through cooling mediums such as air, fluid, and so forth, for the purpose of supporting effective and efficient thermal management.

Typically, without heatsinks to effectively and/or efficiently extract heat generated in operations, components such as power LEDs, high brightness LEDs, high power non-LED components and other components in a device may not have sufficient heat dissipation capabilities and/or heat resistances on their own to maintain or constrain their operational temperatures within their respective normal operational temperature ranges in operational scenarios in which relatively high amounts of heat are generated in the device per unit area per unit time.

Under techniques as described herein, components mounted on PCBs can be thermally coupled to heatsinks attached to the PCBs through solder blades. Efficient thermal transfer paths are formed from the components to the PCBs, and then from the PCBs to the heatsinks, with or without thermal pads inserted between the heatsinks and the PCBs. In operations, the heat generated from the components can be efficiently extracted by the heatsinks through the efficient thermal transfer paths to maintain the components in their respective normal operational temperature ranges.

For example, up to large amounts of heat generated from high power components (e.g., densely packed LED arrays, power LEDs, high brightness LEDs, power transistors, lasers, microLEDs, CPUs, DSPs, discrete components, IC components, etc.) in devices including but not necessarily limited to only to display or non-display devices (e.g., 300-1, 300-2, 300-3, etc.) can be dissipated (or thermally conducted) through PCBs (e.g., 102 of FIG. 1C, etc.) from first sides (e.g., 106 of FIG. 1C, etc.) of the PCBs to second sides (e.g., 112 of FIG. 1C, etc.) of the PCBs because of temperature differences between the first sides and the second sides of the PCBs. Heatsinks attached to the PCBs at the second sides of the PCBs through solder blades can then efficiently and effectively extract the heat reaching the second sides of the PCBs because of temperature differences between the second sides of the PCBs and the heatsink. The heatsinks further dissipate all or substantially all of the heat extracted from (with or without thermal pads inserted between the PCBs and the heatsinks) the second sides of the PCBs to a cooling medium (e.g., air, fluid, etc.). As a result, operational temperatures of the high-power components and other components in the device (300-1) can be prevented from rising above their normal operational temperature ranges.

Additionally, optionally or alternatively, it may be noted that a (e.g., small, large, etc.) amount of heat conduction exists from the PCBs to the solder blades mounted on the PCBs, from the solder blades to a cooling medium (e.g., air, fluid, etc.), from the solder blades to the heatsinks, and so forth. For example, solder blades and a heatsink attached to the solder blades may form an overall heatsink in which the solder blades become fins or extrusions of the overall heatsink.

For the purpose of illustration only, it has been described that one or more thermal pads (e.g., elastomeric pads, etc.) can be disposed between a surface (or side) of a heatsink and an adjacent surface (or side) of a PCB. It should be noted that in various embodiments, other types of gap-filling thermal interface materials (or thermally conductive materials), such as thermal conductive compounds, gels, greases, thermal tapes, phase changing materials, thermally conductive adhesives, paraffin waxes, silicone based materials, and so forth, can be placed between a heatsink and a PCB (or between other adjacent modules/parts) as described herein to fill in or remove airgaps between a heatsink and a PCB and to increase thermal contact (e.g., increasing actual contact points, etc.) in addition to or in place of one or more thermal pads.

The use of these and other thermal interface materials may be used to eliminate, reduce, or overcome any thermal barriers between the PCB and the heatsink, reducing thermal resistance between the PCB and the heatsink, thereby improving overall heat conduction between components mounted on the PCB and the heatsink.

Additionally, optionally or alternatively, thermal pads and/or other gap-filling thermal interface materials can be designed to ensure physical contact pressures between removal clips and the heatsink and between the heatsink and the PCB to be within their respective tolerance ranges.

Under techniques as described herein, some or all of sizes of solder blades, numbers of solder blades, sizes of clip receptacles on a solder blade, widths of solder fingers, distances between adjacent blade fingers, numbers of traces allowed to route through adjacent fingers, sizes of heatsinks, geometries of heatsinks, types of thermal pads, properties of thermal pads, etc., may be determined through some or all of thermal modeling, thermal simulation, pressure diagrams, experimental validations, and so forth.

Design choices for any, some or all of the foregoing may be application specific. For example, application-specific thermal modeling, thermal simulation and experimental validations may be used to determine and verify how much heat is generated by a device of a specific application in operation, how much heat can be extracted through one or more heatsinks attached to the device, how much heat resistance and conductance is between each thermal interface in an overall heat transfer/dissipation path, what a temperature distribution is, and so forth.

Additionally, optionally or alternatively, pressure diagrams and experimental validation may be used to determine or verify mechanical and structural integrities of some or all parts of the device including but not limited to bonding strengths between solder blades and PCBs, pressures or forces exerted between removable clips and heatsinks, pressures or forces exerted by the removable clips on the solder blades, pressure or forces between heatsinks and thermal pads, pressure or forces between thermal pads and the PCBs, and so forth.

Example Process Flows

FIG. 4 illustrates an example method of heatsink attachment according to an embodiment of the present invention. In some embodiments, an assembly system comprising computing devices, robots, placement machines, etc., may perform some or all steps in this process flow. In block 402, one or more components are mounted on at least one of a first side and a second side of a printed circuit board (PCB) in the assembly system. The first side and the second side are two opposite sides of the PCB.

In block 404, a plurality of solder blades is mounted on the second side of the PCB in the assembly system.

In block 406, one or more heatsinks are inserted onto the plurality of solder blades mounted on the second side of the PCB in the assembly system.

In block 408, a plurality of removable clips is used to fasten the one or more heatsinks to the PCB and the plurality of solder blades.

In an embodiment, one or more thermal pads are inserted in between the second side of the PCB and the one or more heatsinks.

In an embodiment, each solder blade in the plurality of solder blades comprises a plurality of solder fingers; the plurality of solder blades is mounted on the PCB via surface mount by soldering each such plurality of solder fingers onto the PCB.

In an embodiment, the plurality of solder fingers comprises two adjacent solder fingers with a specific distance to allow routing through a specific number of traces in between the two adjacent solder fingers.

In an embodiment, the PCB is a part of a light source device; the one or more components mounted on at least one of a first side and a second side of the PCB include one or more light emitting diode (LED) arrays mounted on the first side of the PCB. In an embodiment, the light source device is a part of a display device; the one or more LED arrays of the light source device operates to generate backlight in image rendering operations of the display device; the backlight as generated by the one or more LED arrays is to transmit through one or more light modulation layers that modulate the backlight based on one or more pixel values of one or more video images. In an embodiment, the light source device is a part of a display device; the one or more LED arrays of the light source device operates to directly generate modulated light in image rendering operations of the display device; the modulated light is generated based on one or more pixel values of one or more video images.

In an embodiment, the one or more LED arrays are mounted to the PCB through soldering.

In an embodiment, the one or more LED arrays are mounted to the PCB through adhesion.

In an embodiment, the PCB is a part of a light source device; the one or more components mounted on at least one of a first side and a second side of the PCB include one or more light emitters mounted on at least one of the first side and the second side of the PCB; the light source device is a part of a non-display device.

In an embodiment, the PCB is a part of a non-light-source device.

In an embodiment, each solder blade in the plurality of solder blades comprises one or more clip receptacles into which one or more removable clips in the plurality of removable clips are removably inserted.

In an embodiment, each solder blade in the plurality of solder blades is made of one or more of: copper, aluminum, metal alloy, composite materials, and so forth.

In an embodiment, each heatsink in the one or more heatsinks represents a fin-type heatsink, a pin-type heatsink, an extrusion-type heatsink, a plate-type heatsink, a heatsink with a heat spreader, and so forth.

In an embodiment, in operation, the one or more heatsinks dissipate heats generated by the one or more components through air.

In an embodiment, in operation, the one or more heatsinks dissipate heats through fluid.

In an embodiment, a plurality of removable clips is used to fasten the one or more heatsinks to the PCB and the plurality of solder blades.

In an embodiment, a computing device comprising one or more processors and one or more storage media storing a set of instructions which, when executed by the one or more processors, cause performance of some or all steps in any of the foregoing methods.

Note that, although separate embodiments are discussed herein, any combination of embodiments and/or partial embodiments discussed herein may be combined to form further embodiments.

Example Computer System Implementation

Embodiments of the present invention may be implemented with a computer system, systems configured in electronic circuitry and components, an integrated circuit (IC) device such as a microcontroller, a field programmable gate array (FPGA), or another configurable or programmable logic device (PLD), a discrete time or digital signal processor (DSP), an application specific IC (ASIC), and/or apparatus that includes one or more of such systems, devices or components. The computer and/or IC may perform, control, or execute instructions relating to the adaptive perceptual quantization of images with enhanced dynamic range, such as those described herein. The computer and/or IC may compute any of a variety of parameters or values that relate to the adaptive perceptual quantization processes described herein. The image and video embodiments may be implemented in hardware, software, firmware and various combinations thereof.

Certain implementations of the invention comprise computer processors which execute software instructions which cause the processors to perform a method of the invention. For example, one or more processors in a display, an encoder, a set top box, a transcoder or the like may implement methods related to adaptive perceptual quantization of HDR images as described above by executing software instructions in a program memory accessible to the processors. The invention may also be provided in the form of a program product. The program product may comprise any non-transitory medium which carries a set of computer-readable signals comprising instructions which, when executed by a data processor, cause the data processor to execute a method of the invention. Program products according to the invention may be in any of a wide variety of forms. The program product may comprise, for example, physical media such as magnetic data storage media including floppy diskettes, hard disk drives, optical data storage media including CD ROMs, DVDs, electronic data storage media including ROMs, flash RAM, or the like. The computer-readable signals on the program product may optionally be compressed or encrypted.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (e.g., that is functionally equivalent), including components which are not structurally equivalent to the disclosed structure which performs the function in the illustrated example embodiments of the invention.

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 5:
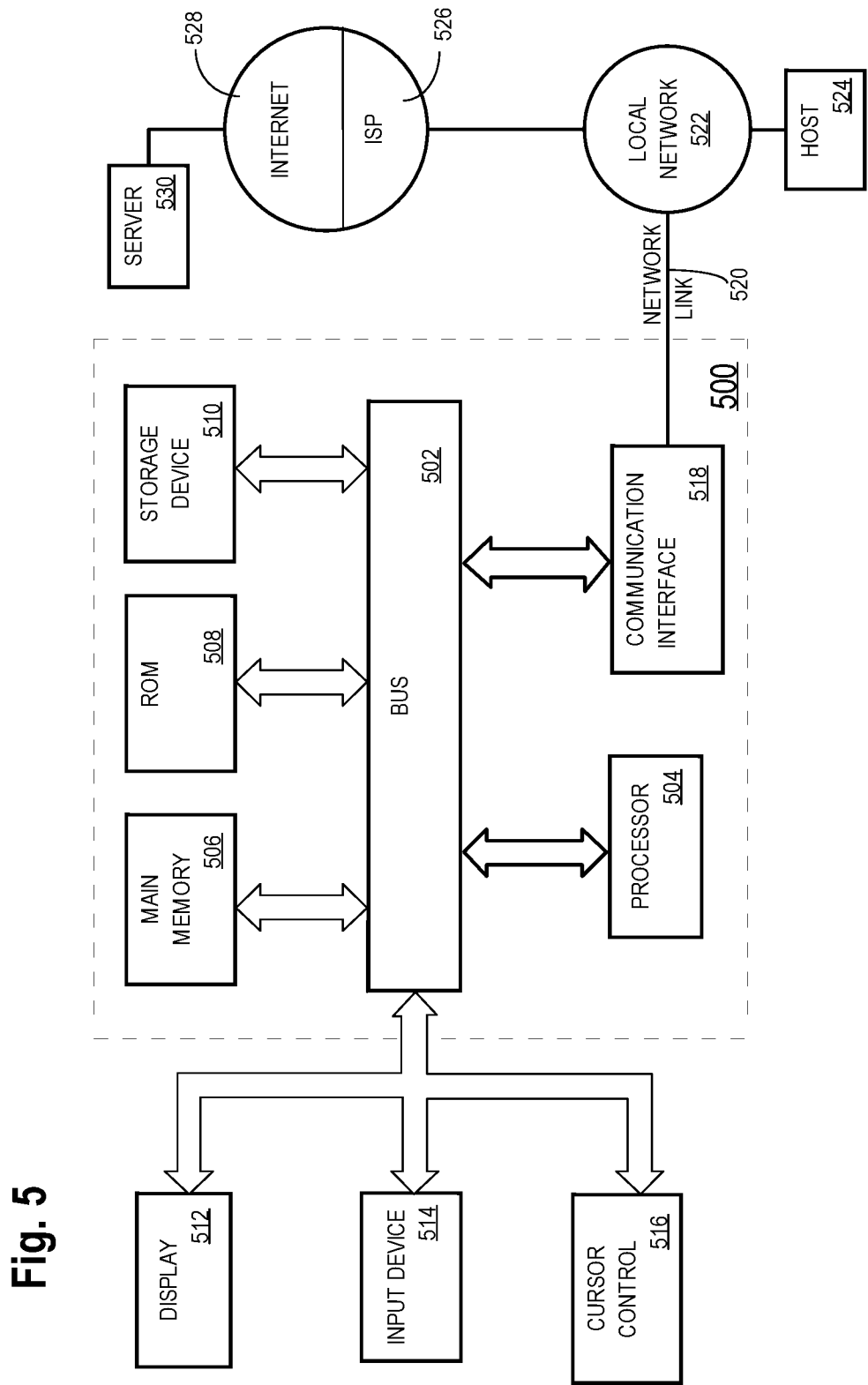
FIG. 5 illustrates a simplified block diagram of an example hardware platform on which a computer or a computing device as described herein may be implemented.

For example, FIG. 5 is a block diagram that illustrates a computer system 500 upon which an embodiment of the invention may be implemented. Computer system 500 includes a bus 502 or other communication mechanism for communicating information, and a hardware processor 504 coupled with bus 502 for processing information. Hardware processor 504 may be, for example, a general purpose microprocessor.

Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Such instructions, when stored in non-transitory storage media accessible to processor 504, render computer system 500 into a special-purpose machine that is customized to perform the operations specified in the instructions.

Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a liquid crystal display, for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques as described herein are performed by computer system 500 in response to processor 504 executing one or more sequences of one or more instructions contained in main memory 506. Such instructions may be read into main memory 506 from another storage medium, such as storage device 510. Execution of the sequences of instructions contained in main memory 506 causes processor 504 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 510. Volatile media includes dynamic memory, such as main memory 506. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 502. Transmission media can also take the form of acoustic or light waves, such as those generated during radio-wave and infra-red data communications.

Various forms of media may be involved in carrying one or more sequences of one or more instructions to processor 504 for execution. For example, the instructions may initially be carried on a magnetic disk or solid state drive of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card, cable modem, satellite modem, or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are example forms of transmission media.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution.

EQUIVALENTS, EXTENSIONS,
ALTERNATIVES AND MISCELLANEOUS

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

Enumerated Exemplary Embodiments

The invention may be embodied in any of the forms described herein, including, but not limited to the following Enumerated Example Embodiments (EEEs) which describe structure, features, and functionality of some portions of the present invention.

EEE1

An electronic device comprising:
a printed circuit board (PCB);
one or more components mounted on at least one of a first side and a second side of the PCB, wherein the first side and the second side are two opposite sides of the PCB;
a plurality of solder blades mounted on the second side of the PCB;
one or more heatsinks inserted onto the plurality of solder blades mounted on the second side of the PCB;
a plurality of removable clips that fasten the one or more heatsinks to the PCB and the plurality of solder blades.

EEE2

The electronic device of EEE1, wherein the electronic device comprises one or more thermal pads inserted in between the second side of the PCB and the one or more heatsinks.

EEE3

The electronic device of EEE1, wherein each solder blade in the plurality of solder blades comprises a plurality of solder fingers, and wherein the plurality of solder blades is mounted on the PCB via surface mount by soldering each such plurality of solder fingers onto the PCB.

EEE4

The electronic device of EEE3, wherein the plurality of solder fingers comprises two adjacent solder fingers with a specific distance to allow routing through a specific number of traces in between the two adjacent solder fingers.

EEE5

The electronic device of EEE1, wherein the electronic device represents a light source device, and wherein the one or more components mounted on at least one of a first side and a second side of the PCB include one or more light emitting diode (LED) arrays mounted on the first side of the PCB.

EEE6

The electronic device of EEE5, wherein the light source device is a part of a display device; wherein the one or more LED arrays of the light source device operates to generate backlight in image rendering operations of the display device; wherein the backlight as generated by the one or more LED arrays is to transmit through one or more light modulation layers that modulate the backlight based on one or more pixel values of one or more video images.

EEE7

The electronic device of EEE5, wherein the light source device is a part of a display device; wherein the one or more LED arrays of the light source device operates to directly generate modulated light in image rendering operations of the display device; wherein the modulated light is generated based on one or more pixel values of one or more video images.

EEE8

The electronic device of EEE1, wherein the one or more LED arrays are mounted to the PCB through soldering.

EEE9

The electronic device of EEE1, wherein the one or more LED arrays are mounted to the PCB through adhesion.

EEE10

The electronic device of EEE1, wherein the electronic device represents a light source device, wherein the one or more components mounted on at least one of a first side and a second side of the PCB include one or more light emitters mounted on at least one of the first side and the second side of the PCB, and wherein the light source device is a part of a non-display device.

EEE11

The electronic device of EEE1, wherein the electronic device represents a non-light-source device.

EEE12

The electronic device of EEE1, wherein each solder blade in the plurality of solder blades comprises one or more clip receptacles into which one or more removable clips in the plurality of removable clips are removably inserted.

EEE13

The electronic device of EEE1, wherein each solder blade in the plurality of solder blades is made of one or more of: copper, aluminum, metal alloy, or composite materials.

EEE14

The electronic device of EEE1, wherein each heatsink in the one or more heatsinks represents a fin-type heatsink, a pin-type heatsink, an extrusion-type heatsink, a plate-type heatsink, or a heatsink with a heat spreader.

EEE15

The electronic device of EEE1, wherein, in operation, the one or more heatsinks dissipate heats generated by the one or more components through air.

EEE16

The electronic device of EEE1, wherein, in operation, the one or more heatsinks dissipate heats through fluid.

EEE17

The electronic device of EEE1, wherein the electronic device further comprises a plurality of removable clips that fasten the one or more heatsinks to the PCB and the plurality of solder blades.

EEE18

A method of heatsink attachment, comprising:
mounting one or more components on at least one of a first side and a second side of a printed circuit board (PCB), wherein the first side and the second side are two opposite sides of the PCB;
mounting a plurality of solder blades on the second side of the PCB;
inserting one or more heatsinks onto the plurality of solder blades mounted on the second side of the PCB;
using a plurality of removable clips to fasten the one or more heatsinks to the PCB and the plurality of solder blades.

EEE19

The method of EEE18, further comprising inserting one or more thermal pads in between the second side of the PCB and the one or more heatsinks.

EEE20

The method of EEE18, wherein each solder blade in the plurality of solder blades comprises a plurality of solder fingers, and wherein the plurality of solder blades is mounted on the PCB via surface mount by soldering each such plurality of solder fingers onto the PCB.

EEE21

The method of EEE20, wherein the plurality of solder fingers comprises two adjacent solder fingers with a specific distance to allow routing through a specific number of traces in between the two adjacent solder fingers.

EEE22

The method of EEE18, wherein the PCB is a part of a light source device, and wherein the one or more components mounted on at least one of a first side and a second side of the PCB include one or more light emitting diode (LED) arrays mounted on the first side of the PCB.

EEE23

The method of EEE22, wherein the light source device is a part of a display device; wherein the one or more LED arrays of the light source device operates to generate backlight in image rendering operations of the display device; wherein the backlight as generated by the one or more LED arrays is to transmit through one or more light modulation layers that modulate the backlight based on one or more pixel values of one or more video images.

EEE24

The method of EEE22, wherein the light source device is a part of a display device; wherein the one or more LED arrays of the light source device operates to directly generate modulated light in image rendering operations of the display device; wherein the modulated light is generated based on one or more pixel values of one or more video images.

EEE25

The method of EEE18, wherein the one or more LED arrays are mounted to the PCB through soldering.

EEE26

The method of EEE18, wherein the one or more LED arrays are mounted to the PCB through adhesion.

EEE27

The method of EEE18, wherein the PCB is a part of a light source device, wherein the one or more components mounted on at least one of a first side and a second side of the PCB include one or more light emitters mounted on at least one of the first side and the second side of the PCB, and wherein the light source device is a part of a non-display device.

EEE28

The method of EEE18, wherein the PCB is a part of a non-light-source device.

EEE29

The method of EEE18, wherein each solder blade in the plurality of solder blades comprises one or more clip receptacles into which one or more removable clips in the plurality of removable clips are removably inserted.

EEE30

The method of EEE18, wherein each solder blade in the plurality of solder blades is made of one or more of: copper, aluminum, metal alloy, or composite materials.

EEE31

The method of EEE18, wherein each heatsink in the one or more heatsinks represents a fin-type heatsink, a pin-type heatsink, an extrusion-type heatsink, a plate-type heatsink, or a heatsink with a heat spreader.

EEE32

The method of EEE18, wherein, in operation, the one or more heatsinks dissipate heats generated by the one or more components through air.

EEE33

The method of EEE18, wherein, in operation, the one or more heatsinks dissipate heats through fluid.

EEE34

The method of EEE18, further comprising: using a plurality of removable clips to fasten the one or more heatsinks to the PCB and the plurality of solder blades.

EEE35

A display device comprising:
a light source device that includes:
a printed circuit board (PCB);
one or more light emitting diode (LED) arrays disposed on a first side of the PCB;
a plurality of solder blades mounted through a plurality of fingers on a second side of the PCB via surface mount;
one or more heatsinks attached to the plurality of solder blades;
one or more light modulation layers that comprise a plurality of light modulation units illuminated by light emitted by the one or more LED arrays;
wherein individual light modulation states of light modulation units in the plurality of light modulation units are set based at least in part on image content of one or more video images to be rendered by the display device.

EEE36

A display device comprising:
a light source device that includes:
a printed circuit board (PCB);
one or more light emitting diode (LED) arrays disposed on a first side of the PCB;
a plurality of solder blades mounted through a plurality of fingers on a second side of the PCB via surface mount;
one or more heatsinks attached to the plurality of solder blades;
wherein individual LEDs in the one or more LED arrays are to emit modulated light that is modulated based at least in part on image content of one or more video images to be rendered by the display device.

What is claimed is:

1. An electronic device comprising:
a printed circuit board (PCB);
one or more components mounted on at least one of a first side and a second side of the PCB, wherein the first side and the second side are two opposite sides of the PCB;
a plurality of solder blades mounted on the second side of the PCB;
one or more heatsinks inserted onto the plurality of solder blades mounted on the second side of the PCB.

2. The electronic device of claim 1, wherein the electronic device comprises one or more thermal pads inserted in between the second side of the PCB and the one or more heatsinks.

3. The electronic device of claim 1, wherein each solder blade in the plurality of solder blades comprises a plurality of solder fingers, and wherein the plurality of solder blades is mounted on the PCB via surface mount by soldering each such plurality of solder fingers onto the PCB.

4. The electronic device of claim 3, wherein the plurality of solder fingers comprises two adjacent solder fingers with a specific distance to allow routing through a specific number of traces in between the two adjacent solder fingers.

5. The electronic device of claim 1, wherein the electronic device represents a light source device, and wherein the one or more components mounted on at least one of a first side and a second side of the PCB include one or more light emitting diode (LED) arrays mounted on the first side of the PCB.

6. The electronic device of claim 5, wherein the light source device is a part of a display device; wherein the one or more LED arrays of the light source device operates to generate backlight in image rendering operations of the display device; wherein the backlight as generated by the one or more LED arrays is to transmit through one or more light modulation layers that modulate the backlight based on one or more pixel values of one or more video images.

7. The electronic device of claim 5, wherein the light source device is a part of a display device; wherein the one or more LED arrays of the light source device operates to directly generate modulated light in image rendering operations of the display device; wherein the modulated light is generated based on one or more pixel values of one or more video images.

8. The electronic device of claim 1, wherein the one or more LED arrays are mounted to the PCB through soldering.

9. The electronic device of claim 1, wherein the one or more LED arrays are mounted to the PCB through adhesion.

10. The electronic device of claim 1, wherein the electronic device represents a light source device, wherein the one or more components mounted on at least one of a first side and a second side of the PCB include one or more light emitters mounted on at least one of the first side and the second side of the PCB, and wherein the light source device is a part of a non-display device.

11. The electronic device of claim 1, wherein the electronic device represents a non-light-source device.

12. The electronic device of claim 1, wherein each solder blade in the plurality of solder blades comprises one or more clip receptacles into which one or more removable clips in the plurality of removable clips are removably inserted.

13. The electronic device of claim 1, wherein each solder blade in the plurality of solder blades is made of one or more of: copper, aluminum, metal alloy, or composite materials.

14. The electronic device of claim 1, wherein each heatsink in the one or more heatsinks represents a fin-type heatsink, a pin-type heatsink, an extrusion-type heatsink, a plate-type heatsink, or a heatsink with a heat spreader.

15. The electronic device of claim 1, wherein, in operation, the one or more heatsinks dissipate heats generated by the one or more components through air.

16. The electronic device of claim 1, wherein, in operation, the one or more heatsinks dissipate heats through fluid.

17. The electronic device of claim 1, wherein the electronic device further comprises a plurality of removable clips that fasten the one or more heatsinks to the PCB and the plurality of solder blades.

18. A display device comprising:
a light source device that includes:
a printed circuit board (PCB);
one or more light emitting diode (LED) arrays disposed on a first side of the PCB;
a plurality of solder blades mounted through a plurality of fingers on a second side of the PCB via surface mount;
one or more heatsinks attached to the plurality of solder blades;
one or more light modulation layers that comprise a plurality of light modulation units illuminated by light emitted by the one or more LED arrays;
wherein individual light modulation states of light modulation units in the plurality of light modulation units are set based at least in part on image content of one or more video images to be rendered by the display device.

19. A display device comprising:
a light source device that includes:
a printed circuit board (PCB);
one or more light emitting diode (LED) arrays disposed on a first side of the PCB;
a plurality of solder blades mounted through a plurality of fingers on a second side of the PCB via surface mount;
one or more heatsinks attached to the plurality of solder blades;
wherein individual LEDs in the one or more LED arrays are to emit modulated light that is modulated based at least in part on image content of one or more video images to be rendered by the display device.

* * * * *